(12) United States Patent
Wardle et al.

(10) Patent No.: US 10,523,171 B2
(45) Date of Patent: Dec. 31, 2019

(54) METHOD FOR DYNAMIC SOUND EQUALIZATION

(71) Applicant: Sony Interactive Entertainment Inc, Tokyo (JP)

(72) Inventors: Scott Wardle, Foster City, CA (US); Jeppe Oland, San Francisco, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 15/890,007

(22) Filed: Feb. 6, 2018

(65) Prior Publication Data

US 2019/0245503 A1 Aug. 8, 2019

(51) Int. Cl.
*H03G 5/16* (2006.01)
*H04R 5/02* (2006.01)
*H04S 7/00* (2006.01)

(52) U.S. Cl.
CPC .............. *H03G 5/165* (2013.01); *H04R 5/02* (2013.01); *H04S 7/30* (2013.01); *H04S 7/301* (2013.01); *H04S 7/303* (2013.01); *H04S 2400/13* (2013.01)

(58) Field of Classification Search
CPC .... H03G 5/65; H04R 5/02; H04S 7/30; H04S 2400/13
See application file for complete search history.

(56) References Cited

U.S. PATENT DOCUMENTS

| | | | |
|---|---|---|---|
| 7,158,643 B2* | 1/2007 | Lavoie | H04S 7/301 |
| | | | 381/303 |
| 9,980,076 B1* | 5/2018 | Pratt | H04S 7/303 |
| 2009/0086998 A1* | 4/2009 | Jeong | H04R 3/005 |
| | | | 381/119 |
| 2012/0213375 A1 | 8/2012 | Mahabub et al. | |
| 2012/0224701 A1* | 9/2012 | Sakai | H04S 7/301 |
| | | | 381/17 |

(Continued)

FOREIGN PATENT DOCUMENTS

| | | |
|---|---|---|
| WO | 2017125821 A1 | 7/2017 |
| WO | 2018026963 A1 | 2/2018 |
| WO | 2018060550 A1 | 4/2018 |

OTHER PUBLICATIONS

International Search Report & Written Opinion dated Mar. 5, 2019 for International Patent Application No. PCT/US2019/016126.

*Primary Examiner* — Sonia L Gay
(74) *Attorney, Agent, or Firm* — JDI Patent; Joshua D. Isenberg; Robert Pullman

(57) ABSTRACT

Aspects of the present disclosure relate to techniques for adjustment of room sound levels, comprising; driving a speaker with a known waveform, detecting a sound wave from the speaker with at least two microphones wherein the at least two microphones are configured in a known orientation, utilizing the known waveform and the sound wave detected by the at least two microphones and the known orientation of the at least two microphones to generate a room sound dynamic; applying a filter to adjust a sound level to account for the room sound dynamic. The room sound dynamic may be the speaker layout of the room, the room impulse response, the distance or angle of each speaker from the center of the room or other physical constraints that may affect the user's perception of sound coming from a sound system.

26 Claims, 12 Drawing Sheets

(56) References Cited

U.S. PATENT DOCUMENTS

| | | | |
|---|---|---|---|
| 2012/0288124 A1* | 11/2012 | Fejzo | H04R 5/02 |
| | | | 381/303 |
| 2014/0270245 A1 | 9/2014 | Elko et al. | |
| 2014/0355794 A1 | 12/2014 | Morrell et al. | |
| 2015/0170657 A1 | 6/2015 | Thompson et al. | |
| 2015/0382128 A1* | 12/2015 | Ridihalgh | H04S 7/301 |
| | | | 381/57 |
| 2016/0302005 A1 | 10/2016 | Fedosov et al. | |
| 2017/0188174 A1* | 6/2017 | Lee | H04S 7/303 |
| 2017/0366912 A1 | 12/2017 | Stein et al. | |

* cited by examiner

METHOD FOR DYNAMIC SOUND EQUALIZATION

FIELD

The present disclosure relates to audio signal processing and sound localization. In particular, aspects of the present disclosure relate to equalization and optimization of sounds in a multi-speaker system.

BACKGROUND

Human beings are capable of recognizing the source location, i.e., distance and direction, of sounds heard through the ears through a variety of auditory cues related to head and ear geometry, as well as the way sounds are processed in the brain. Surround sound systems attempt to enrich the audio experience for listeners by outputting sounds from various locations which surround the listener.

Typical surround sound systems utilize an audio signal having multiple discrete channels that are routed to a plurality of speakers, which may be arranged in a variety of known formats. For example, 5.1 surround sound utilizes five full range channels and one low frequency effects (LFE) channel (indicated by the numerals before and after the decimal point, respectively). For 5.1 surround sound, the speakers corresponding to the five full range channels would then typically be arranged in a room with three of the full range channels arranged in front of the listener (in left, center, and right positions) and with the remaining two full range channels arranged behind the listener (in left and right positions). The LFE channel is typically output to one or more subwoofers (or sometimes routed to one or more of the other loudspeakers capable of handling the low frequency signal instead of dedicated subwoofers). A variety of other surround sound formats exists, such as 6.1, 7.1, 10.2, and the like, all of which generally rely on the output of multiple discrete audio channels to a plurality of speakers arranged in a spread out configuration. The multiple discrete audio channels may be coded into the source signal with one-to-one mapping to output channels (e.g. speakers), or the channels may be extracted from a source signal having fewer channels, such as a stereo signal with two discrete channels, using other techniques like matrix decoding to extract the channels of the signal to be played.

Surround sound systems have become popular over the years in movie theaters, home theaters, and other system setups, as many movies, television shows, video games, music, and other forms of entertainment take advantage of the sound field created by a surround sound system to provide an enhanced audio experience. However, there are several drawbacks with traditional surround sound systems, particularly in a home theater application. For example, creating an ideal surround sound field is typically dependent on optimizing the physical setup of the speakers of the surround sound system, but physical constraints and other limitations may prevent optimal setup of the speakers. Additionally for interactive media like video games simulation of the location of sound is not as precise as the speakers are only used to convey information based on the location of each channel.

Creating an ideal sound for a speaker system is often a time consuming and labor intensive process. In a speaker system, optimization of the sound for a given room is a subjective and time consuming process. For large events like concerts audio engineers typically have a booth in the middle or towards the rear of a venue where they will manipulate the volume of music being played. An audio engineer will listen to the music being played and manipulate the sound volume through a set of controls in the booth. Modern Sound boards allow Audio Engineers to manipulate the volume of sound based on frequency. Yet this process of audio optimization is highly subjective and each audio engineer may have different sound preferences. Consequently, some musicians choose to use one engineer to the exclusion of others. Thus it would preferable to develop a way to control the sound of a room that removes the subjectivity of a human audio engineer and create a consistent room sound.

In home audio systems, sound optimization is typically performed by the user if it is performed at all. Some small home systems have audio presets that allow the user to select from several options which may compensate for a few common room types or add room effects. True sound optimization for a room can be a difficult process for the home user as there is no real guide as to the optimum sound response of a given room. A user may spend a large amount of time listening to music coming from each channel of the speaker system and adjusting volume levels to create the desired sound. Thus most modern home surround sound systems are not well optimized for their room because it is a time consuming process with no well-defined method. Additionally unlike in the concert setting for a home user continuous optimization of sound is not currently possible as most users would rather simply listen to the media playing through speakers than focus on changing the audio levels. Thus it would be desirable for there to be a system that allows for fast, easy and continuous audio optimization in the context of home audio systems.

It is within this context that aspects of the present disclosure arise.

SUMMARY

Aspects of the present disclosure include a method for adjustment of room sound levels. The method includes driving a speaker with a known waveform, detecting a sound wave from the speaker with at least two microphones. The microphones are configured in a known orientation. The known waveform and the sound wave detected by the microphones and the known orientation of the microphones are used to generate a room sound dynamic. Speaker driving signals may be filtered to adjust a sound level of the speaker to account for the room sound dynamic.

In some of these implementations the microphones may be coupled to a game controller. While in other implementation the at least two microphones are on separate controllers arranged in a known configuration.

In some implementation the room sound dynamic includes a speaker location. Further in some of these implementations the room sound dynamic also includes a distance and/or angle of the speakers with respect to the microphones. In some of these implementations independent component analysis may be used to determine the speaker locations.

In some implementation the room sound dynamic includes a room impulse response. In some of these implementations a filter is applied to the known wave form to compensate for unwanted frequencies in the room impulse response.

In some implementations the room sound dynamic may be periodically determined at an interval. In other implementations the room sound dynamic may be determined once.

In some implementations the sound level may be adjusted for a speaker to compensate for movement of a person in front of the speaker. In some implementations the sound level for a speaker may be adjusted to compensate for a furniture layout and/or speaker locations in the room.

Further implementation of the present disclosure may include a non-transitory computer readable medium with instructions embodied thereon wherein the instructions cause a processor to carry out a method comprising; driving a speaker with a known waveform, detecting a sound wave from the speaker with at least two microphones wherein the at least two microphones are configured in a known orientation, utilizing the known waveform and the sound wave detected by the at least two microphones and the known orientation of the at least two microphones to generate a room sound dynamic, filtering speaker driving signals to adjust a sound level of the speaker to account for the room sound dynamic.

BRIEF DESCRIPTION OF THE DRAWINGS

The teachings of the present disclosure can be readily understood by considering the following detailed description in conjunction with the accompanying drawings, in which.

DETAILED DESCRIPTION

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

Aspects of the present disclosure relate to optimization and equalization of sound in a speaker system. Specifically the present disclosure relates to optimization of the sound of a surround sound type speaker system with two or more speakers not worn by the user. Typically in a surround sound type speaker system each speaker is connected to a main controller, sometimes referred to as an amplifier but may also take the form of a computer or game console. Each speaker unit in the surround sound system has a defined data path used to identify the individual unit, called a channel. In most modern speaker systems the overall amplitude or volume of each channel is controllable with the main controller. Additionally each speaker unit may also comprise several individual speakers that have different frequency response characteristics. For example a typical speaker unit comprises both a high range speaker, sometimes referred to as a tweeter and a mid-ranged speaker. These individual speakers typically cannot have their volume controlled individually thus for ease of discussion speaker hereafter will refer to a speaker unit meaning the smallest amount of speakers that can be have its volume controlled.

To that end an automated audio optimization system has been developed that can detect speaker location and the effect of the room on the perceived sound from the speakers also referred to as the room sound dynamic. The room sound dynamic may include the speaker layout of the room, the room impulse response, the distance or angle of each speaker from the center of the room or other physical constraints that may affect the user's perception of sound coming from a sound system. The audio optimization can then use the speaker location and room effects to optimize the sound coming from the speakers.

These and further aspects of the present disclosure will be apparent upon consideration of the following detailed description of various implementation details and their accompanying drawings.

Implementation Details

Figure 1:
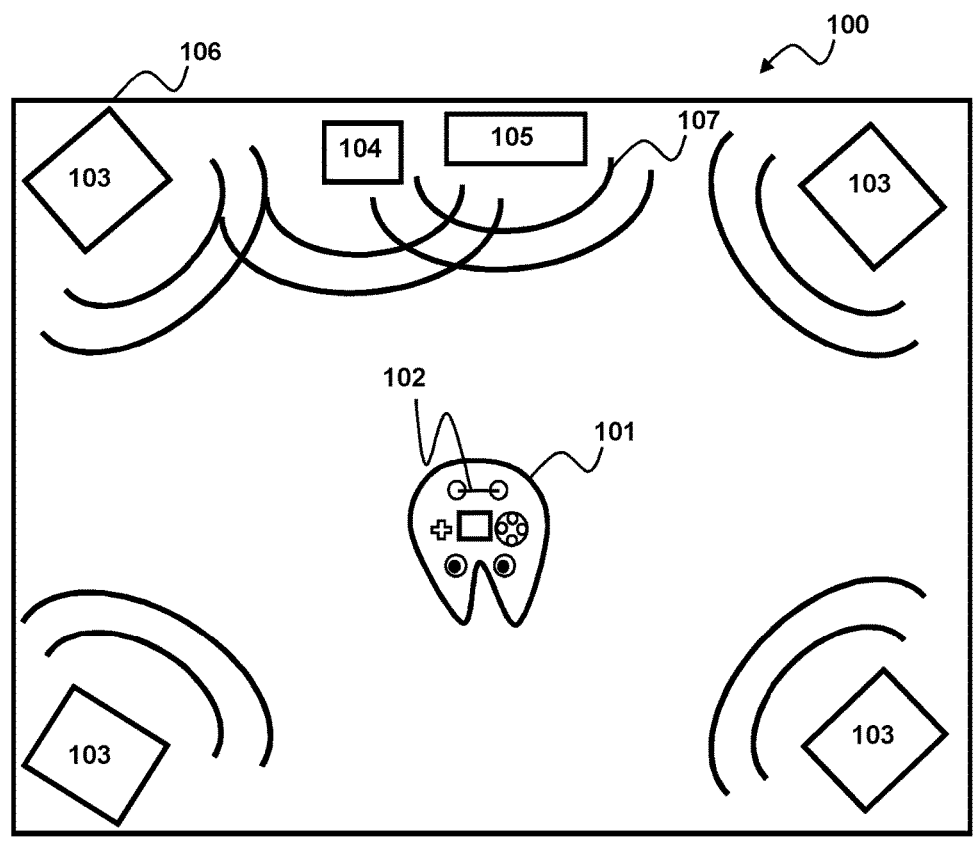
FIG. 1 is a diagram of a surround sound system with a controller having a microphone array according to various aspects of the present disclosure.

Illustrative diagram of an actual surround sound system 100 with a microphone array 102 coupled to a controller is depicted in FIG. 1.

The example actual surround sound system 100 of FIG. 1 includes a plurality of speakers 103, 104, 105, which may be configured in a spread out orientation around a room 106 in order to output sounds which surround a listener. The sounds originating from speakers 103, 104, 105, may include both direct sounds 107, which directly reach each ear of the listener from the different locations of the speakers 116, as well as indirect sounds, which may include early reflections and reverberant sounds as the sounds output from the speakers are reflected around the acoustic environment, e.g., by reflecting off of the walls and other objects of the room (not shown in FIG. 1).

In order to produce a rich acoustic experience for the listener, the actual surround sound system 100 may output an acoustic signal having a plurality of channels, with each channel output to a corresponding one of the speakers 103, 104, 105, to produce different sounds emanating from the different locations of the speakers. Some channels may be differentiated based on location or frequency response, there may be surround channels 103, center channels 105, low frequency channels (also known as subwoofer or sub channels) 104 and the like. By way of example, and not by way of limitation, each output audio channel may be encoded into the source signal with one-to-one mapping for a particular surround sound format, or it may be encoded to a lesser extent, e.g. as a two-channel stereo signal. The encoded source signal may be decoded into a desired number of channels, e.g., using a known matrix decoding technique (for example, 2:5 decoding to decode a stereo signal having two discrete channels into a five channel signal for output to each of the five speakers depicted in FIG. 1).

The resultant sound field generated by the actual surround sound system 100 may create a rich audio experience for the listener that is desirable in many applications, such as movies, video games, and the like; however, such surround sound systems suffer from several drawbacks as mentioned above. As such, it would be desirable to optimize the sound coming from the speakers to account for less than optimal placement of speakers around the room and the effects of the room itself.

In the pictured surround sound system a pair of microphones 102 is coupled to a controller 101 placed within the surround system at a known orientation. The microphones 102 include transducers that convert received sound into corresponding electrical signals that can be analyzed. The electrical signals may be analog electrical signals that can be amplified and analyzed by an analog computer. Alternatively, analog signals generated by the transducers may be sampled over some short window of time and the sampled signal converted to a digital value that can be stored and analyzed by digital signal processing on a digital computer. By way of example, and not by way of limitation, a digital sound file may be constructed from a plurality of samples taken of sound at an interval. By way of example and not by limitation the typical sample interval for the MP3 standard is 44100 samples/second, other standards may vary.

The microphone pair hereinafter referred to as a microphone array 102 includes at least two microphones aligned in the same horizontal plane and separated by a known distance. According to some embodiments a third microphone may be coupled to the controller 101 and a third microphone may be arranged off a line defined by the first and second microphones 102 to provide additional information that can be used, e.g., to determine whether a sound is located to the front or rear of the controller. Still other embodiments may include yet a fourth microphone located outside a plane defined by the first three microphones to provide additional information that may be used for sound source localization. The microphone array may include any number of additional microphones arranged on different axes at known separation distances to provide additional information to the system about the location of sound sources. The importance of the separation distance and axis location will be described further in later sections.

Figure 2:
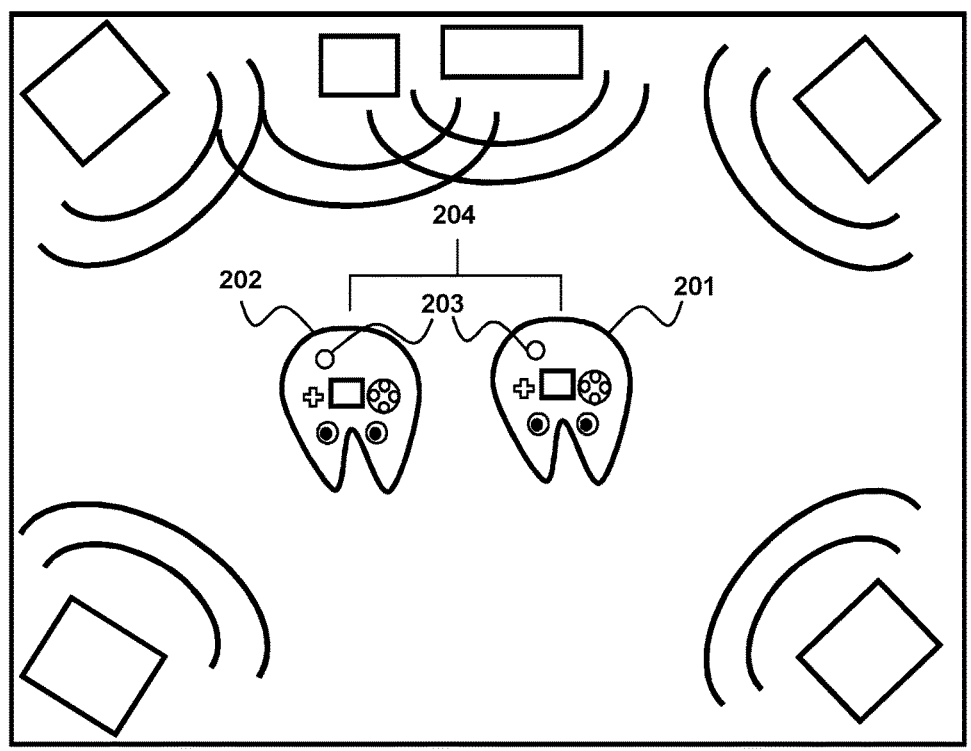
FIG. 2 is a diagram of a surround sound system with two controllers arranged to create a microphone array according to various aspects of the present disclosure.

As depicted in FIG. 2 a microphone array 203 may be constructed from two controllers 201, 202 each having a single microphone. Each controller is arranged at a known distance 204 from the other to form the microphone array. Additional controllers (not shown in FIG. 2) may be added on a different axis set at a known distance from the two controller array for additional speaker alignment information. According to aspects of the present disclosure the microphones in the array may be of any type, but are preferably Omni-directional microphones due to the relatively low price and widespread availability of microphones of that type. In some embodiments of the present disclosure the microphone array is placed in the center of the room. In alternative embodiments of the present invention the microphone array is placed at a known location within the room. In some embodiments that location of the microphone array in relation to sides of the room is determined by user generated information.

Figure 3A:
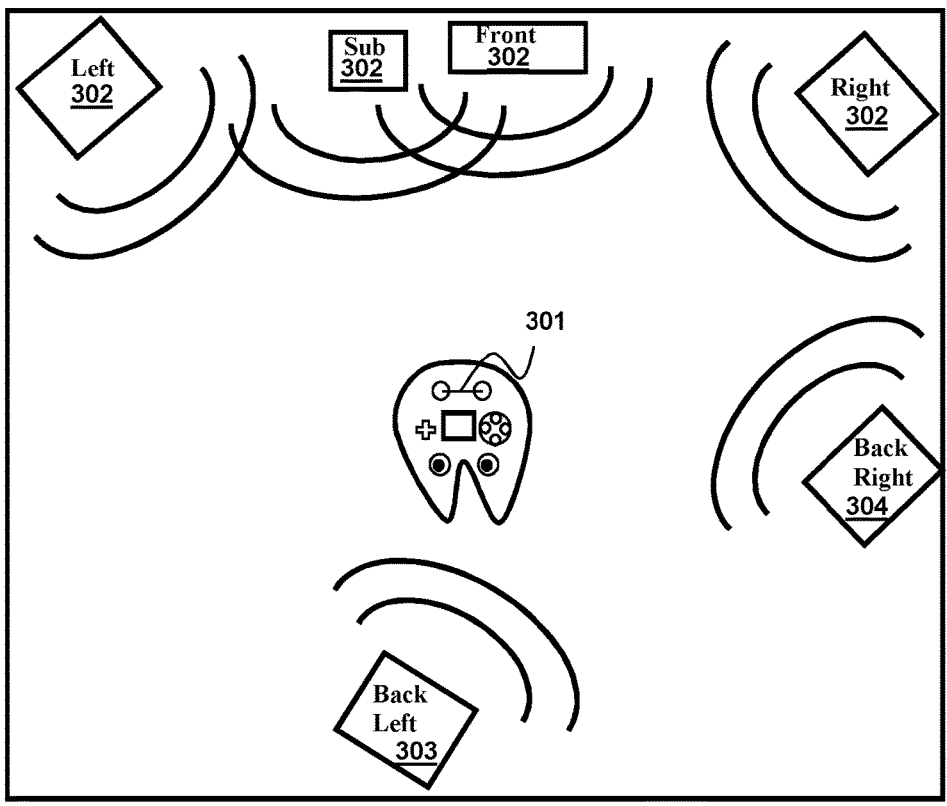
FIG. 3A is a schematic diagram depicting a controller having a microphone array in a room with speakers organized with the rear left speaker in the rear middle of the room according to various aspects of the present disclosure.
Figure 3B:
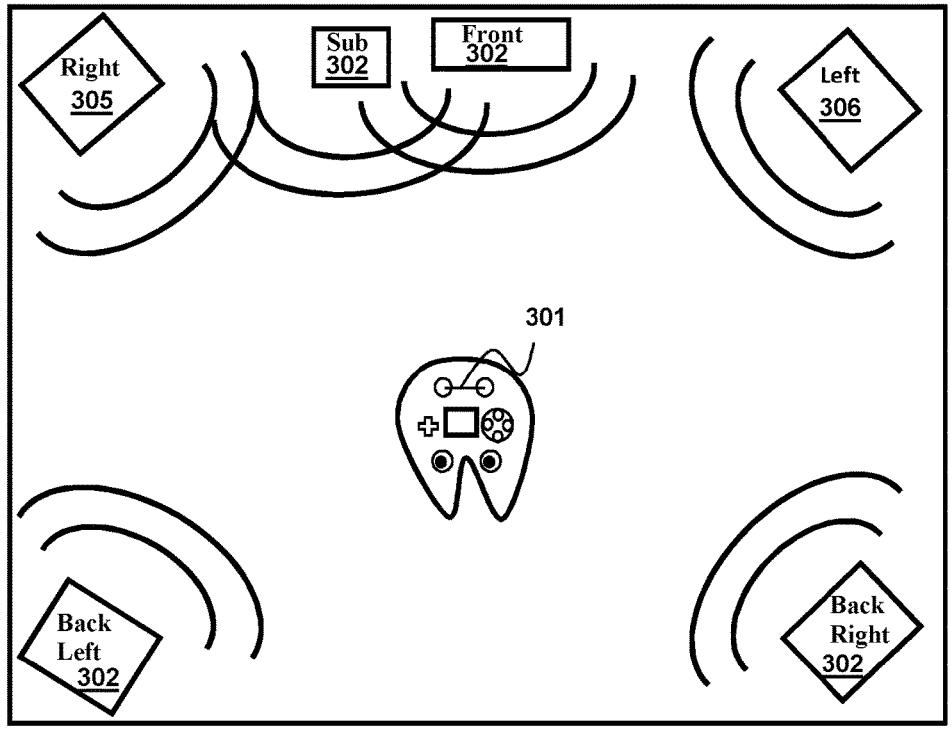
FIG. 3B is a schematic diagram depicting a controller having a microphone array in a room with speakers organized with the left and right speakers switched according to various aspects of the present disclosure.

FIG. 3A and FIG. 3B depict common problems found within existing surround systems. As seen in FIG. 3A the speaker locations may vary from the layout defined by the standard (for example the 5.1 standard requires 4 speakers placed in the respective corners of a square room, a center speaker and subwoofer). In the illustrated situation the back left speaker 303 is placed in the middle of the rear of the room and back right 304 speaker is placed in the forward of the rear of the room while the front left, front right and center and subwoofer 302 all adhere to the standard. FIG. 3B depicts another common case where the speaker placement 302 is in the traditional manner but the channels for the speakers are wrong. In this case the right 305 and left 306 speakers are switched. It would be desirable to create a system that could detect and compensate for abnormal speaker layout or incorrect channel placement without user intervention. Such a method will be discussed in later sections.

Location of the Source of Sound

Figure 4A:
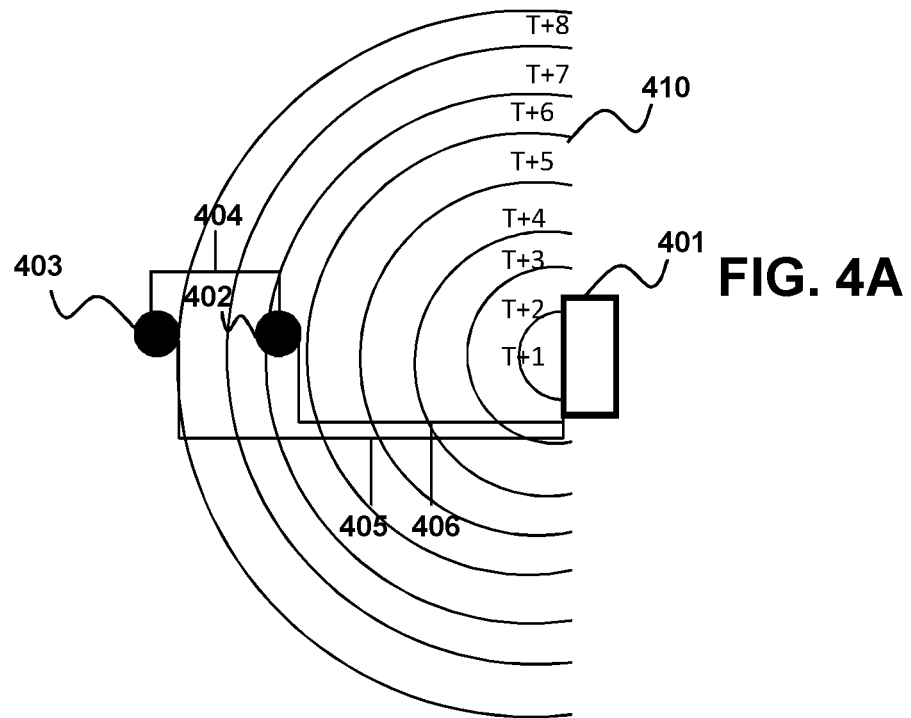
FIG. 4A is a schematic diagram of a point source wave being detected on the right side of a dual microphone array according to various aspects of the present disclosure.
Figure 4B:
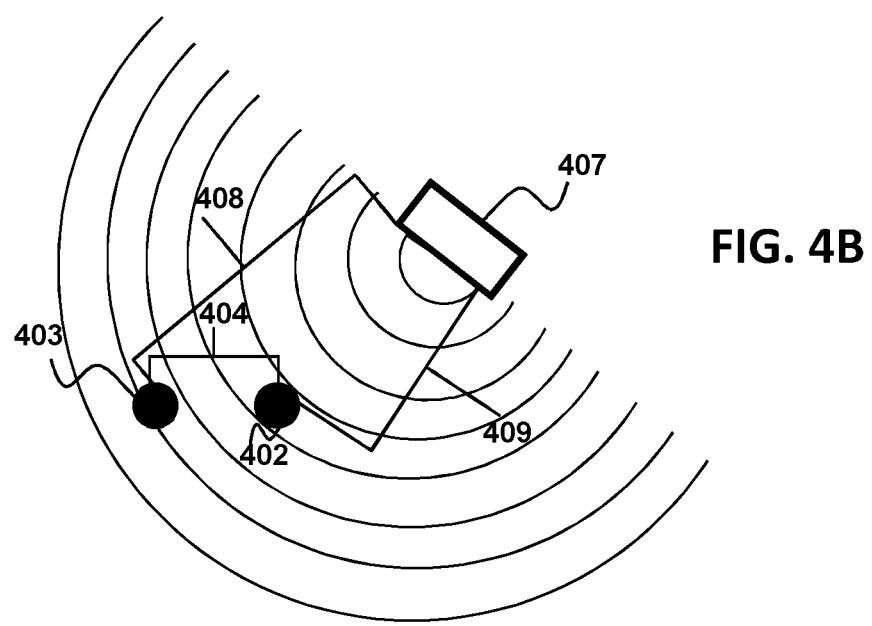
FIG. 4B is a schematic diagram of depicting a point source wave being detected on the front right side of a dual microphone array according to various aspects of the present disclosure.
Figure 6:
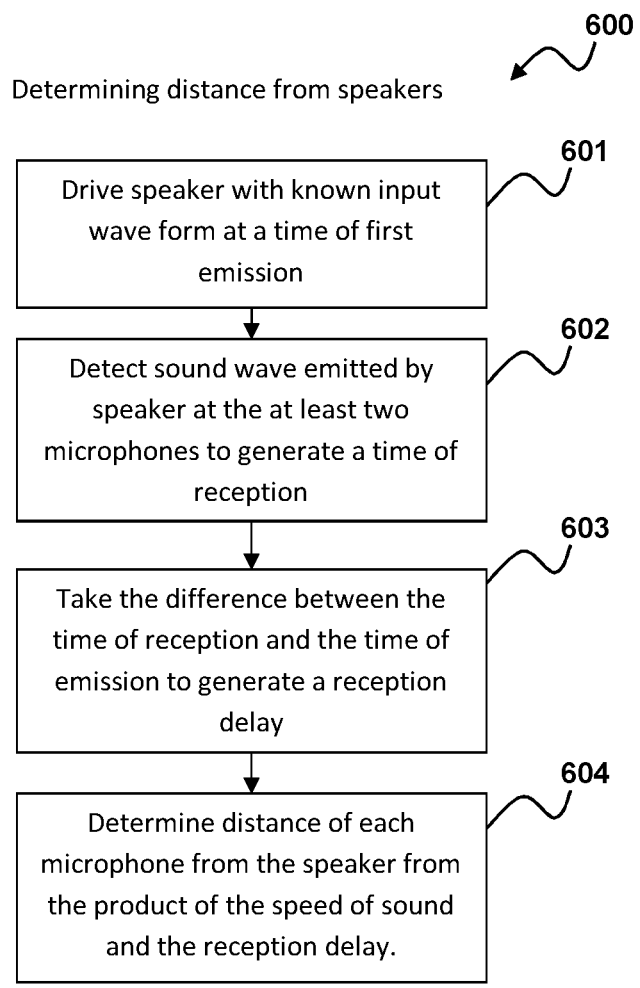
FIG. 6 is a flow diagram of a method for determining the distance a microphone is from a speaker according to various aspects of the present disclosure.

To understand how the location of a sound source may be determined according to the method as provided in FIG. 6 illustrative examples FIGS. 4A and 4B are provided. The method 600 depicted in the flow diagram in FIG. 6 begins at 610 with driving a speaker with a known input waveform at an initial time t. FIG. 4A depicts a sound source 401 such as a speaker emitting a known sound waveform 410. For the sake of this example it may be assumed that the sound wave fronts are spherical. Each curved line depicts a sound wave front 410 propagating through a room at different times (t+1, 2, 3, 4 . . . n). Two microphones 403, 402 are located directly to the right of the sound source. The propagating wave first reaches the right microphone 402 and is detected, as indicated at 602 in FIG. 6 at time t+5 while the wave front does not reach the left microphone 403 until time t+8. To determine the distance from the speaker 406, 407 when the speaker 401 is in line with the two the microphones only the information from one microphone is needed but as the system has no a priori knowledge of the speaker layout at least two microphones are required in each case. The difference between the time that the sound wave first detected ($T_r$) and the time the sound wave is initially created ($T_i$) is taken as indicated at 603 in FIG. 6. This difference is then multiplied by the speed of sound (c) to find the distance from the microphone and the sound source (D) as indicated at 604 in FIG. 6.

$$(T_r - T_i)*c = D \qquad \text{(eq. 1)}$$

With respect to the left microphone 403 the distance from the left microphone and the sound source 401 may be determined according to equation 1. The distance between the two microphones 404, hereinafter referred to as the inter-microphone distance (I) may be subtracted from the distance between the microphone left and the source ($D_L$). From this subtraction a comparison may be made from between the Left and Right microphones to determine whether the sound source lies in line with the microphones to the right side (eq. 2). If the after the subtraction, the distance to the left microphone ($D_L$) is equal to the distance of right microphone ($D_R$) then the source lies to the direct right of the microphone array. Similarly the operation may be performed to the right side signal to determine if the sound source lies on the left side (eq. 3).

$$(D_L - I) = D_R \quad (eq. 2)$$

$$(D_R - I) = D_L \quad (eq. 3)$$

FIG. 4B shows another case where the sound source 407 is to the forward right of the microphone array 403, 402. In this case the distance for each microphone 408, 409 can be determined using eq. 1 and the angle of the sound source to the right microphone can be determined with simple trigonometry (eq. 4).

$$acos\left(\frac{(I^2 + D_R^2 - D_L^2)}{2ID_R}\right) \quad (eq. 4)$$

For a sound source on the left hand side the equation to determine the angle of the sound source with respect to the microphones would be as follows;

$$acos\left(\frac{(I^2 + D_L^2 - D_R^2)}{2ID_L}\right) \quad (eq. 5)$$

A sound source may be determined to be in front or behind the microphone array if determined distance between each of the microphones is equal. That is if $d_L = d_R$ then the sound source lies directly in front or behind the microphone array.

Figure 7:
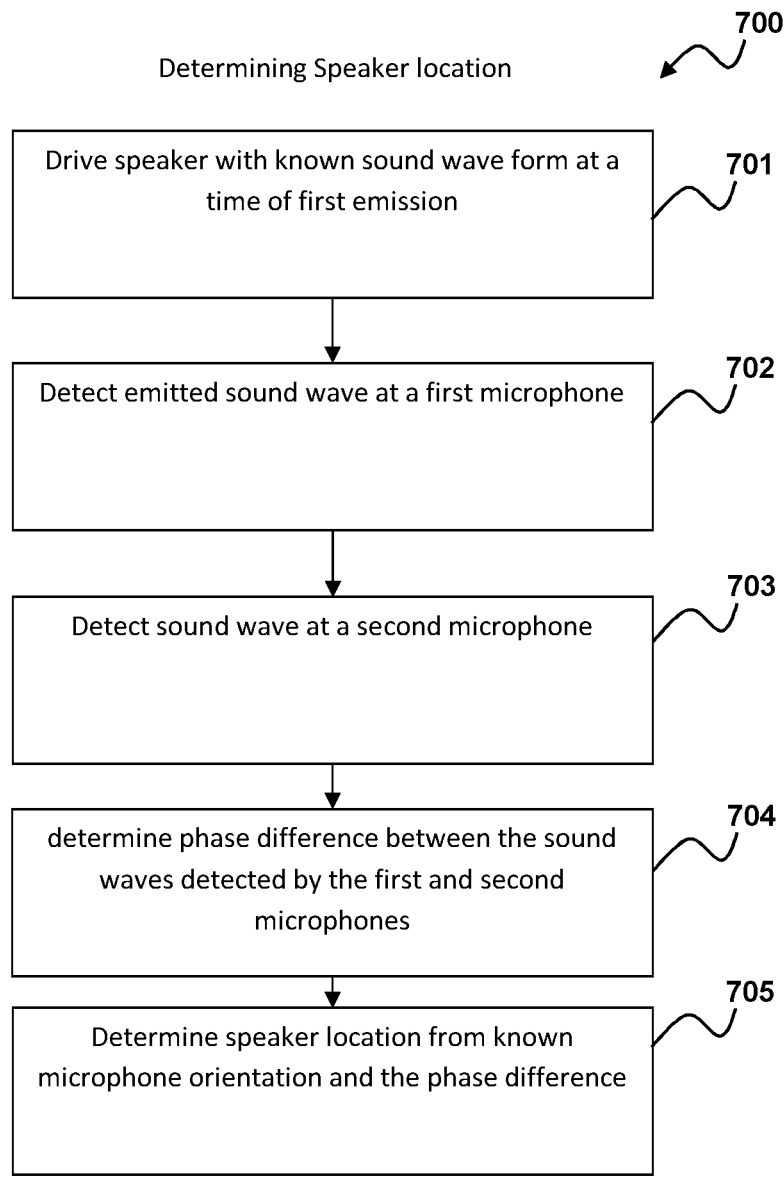
FIG. 7 is a flow diagram of a method for determining the location of speakers according to various aspects of the present disclosure.

Similar in concept to the simple description of determination of distance and angle, speaker location may also be determined using the phase difference between the sounds received at each microphone as shown in FIG. 7. The location of the sound source in relation to the microphones determines the phase difference between the received waves with the largest phase difference when the sound source is located directly to the side of the microphone array. A known wave form is used to drive a speaker 701. The sound waves emitted by the speaker are detected by a first microphone in the microphone array 702. The sound waves are then detected by a second microphone in the microphone array 703. The difference between the two waves received by the microphones at a particular time point is the phase shift.

Though the above described method deals with a single sound source and wave front aspects of the present disclosure are not so limited. The distance and angle of multiple sound sources may be determined by first isolating the sounds corresponding to individual speakers, e.g., using independent component analysis (ICA). Techniques for ICA are explained in greater detail in commonly owned U.S. Pat. Nos. 9,099,096 B2 and 8,880,395 B2 which are incorporated herein by reference. ICA models the mixing process of sound signals as linear mixtures of original source signals, and applies a de-mixing operation that attempts to reverse the mixing process to produce a set of estimated signals corresponding to the original source signals. Basic ICA assumes linear instantaneous mixtures of non-Gaussian source signals, with the number of mixtures equal to the number of source signals. Because the original source signals are assumed to be independent, ICA estimates the original source signals by using statistical methods to extract a set of independent (or at least maximally independent) signals from the mixtures. Once the sounds for individual speakers have been isolated the isolated sounds may be separately analyzed, e.g., as discussed above with respect to FIG. 6 or FIG. 7 to determine the corresponding speaker locations.

Room Impulse Response

Figure 5:
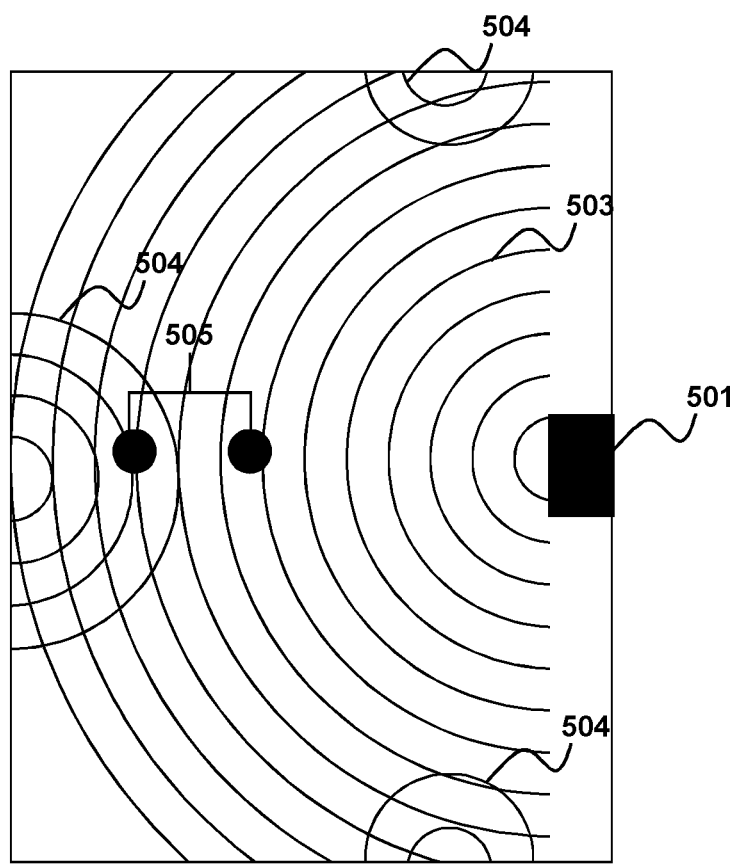
FIG. 5 is a schematic diagram depicting a dual microphone array in a room with a point source on the right side with a room impulse response according to various aspects of the present disclosure.

FIG. 5 depicts a microphone array 505 located in a room with a speaker 501 generating a room impulse response. When a sound signal is emitted by a speaker in a room the sound wave 503 will propagate throughout the room and bounce off of the walls and objects in the room creating secondary waves 504. The generation of the secondary waves depends on the acoustic properties of the room, which may be frequency-dependent. These acoustic properties may be generalized in terms of a room impulse response (RIR). The secondary waves 504 mix with the primary wave 503 emitted by the speaker 501 and this mixture of sound waves is detected by the microphone array 505. Such a mixture may be modeled as a mathematical convolution of the emitted sound wave 503 with the room impulse response.

As is generally understood, the convolution of continuous functions of time t, $f(t)$ and $g(t)$ may be expressed mathematically as:

$$f * g(t) = \int_{-\infty}^{\infty} f(\tau)g(t - \tau)d\tau$$

Similarly, the convolution of discrete functions of index n, $f[n]$ and $g[m]$ may be expressed mathematically as:

$$(f * g)[n] = \sum_{-M}^{M} f[n - m]g[m],$$

where g has finite support over a range of values from $-M$ to M, subject to the condition that the summation converges.

The room impulse response may produce both wanted and unwanted effects on the base primary wave 503. Thus it would be ideal for there to be a way to discover the impulse response of a given room and manipulate the sound signal emitted by the speaker 501 to account for the room impulse response.

Figure 8:
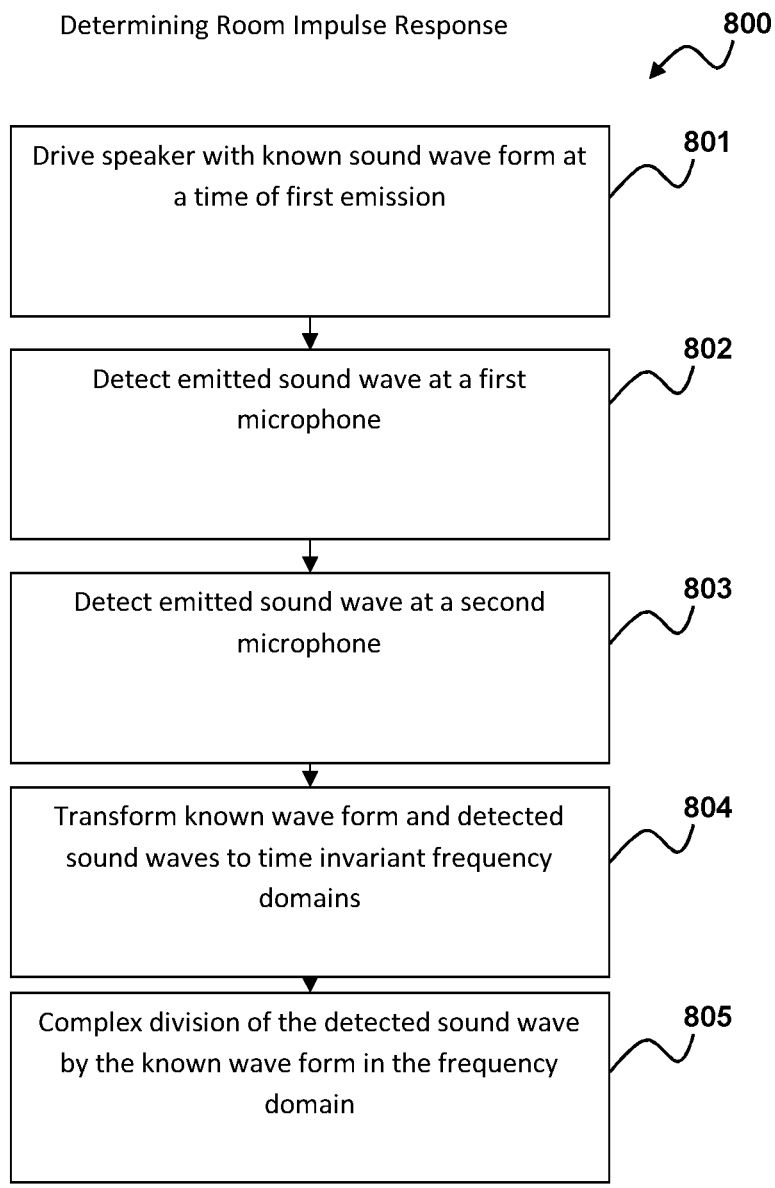
FIG. 8 is a flow diagram depicting a method for determining the impulse response of a room according to various aspects of the present disclosure.

Turning to FIG. 8 a microphone array comprised of at least two microphones separated by a known distance 505 and speaker 501 driven with a known waveform allows for a room impulse response to be discovered. The speaker driven with a known wave form 801 emits corresponding sound 503 which is detected by the first 802 and then the second microphones in the array 803. The emitted sound also reflects and deflects off of the room and objects, persons, etc. within the room 504. These reflections and deflections are included in the waveform detected by the sounds detected by the microphone array.

As noted above, the signal generated by the microphone can be modeled as a convolution of the waveform of the sound 503 emitted from the speaker 501 and the room impulse response (RIR). The sound 503 emitted by the speaker can be determined from the known speaker driving waveform 801, e.g., through a convolution of the driving waveform with an impulse response for the speaker 501. If the speaker and microphone waveforms are known, the room impulse response can be determined through a process of de-convolution.

Figure 9A:
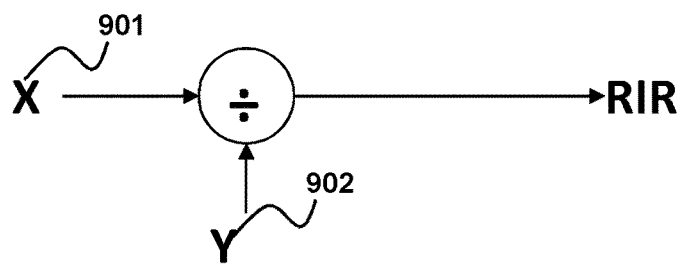
FIG. 9A is a schematic diagram depicting a technique for extracting a room impulse response from a recorded waveform according to various aspects of the present disclosure.

To facilitate the de-convolution computation, the waveform detected by the microphones may be transformed from the time domain to time invariant frequency domains 804. Such a transformation may be performed using known techniques such as Fast Fourier Transform (FFT), Discrete Cosine Transform (DCT) etc. Once the detected wave form has been transformed operations may be performed on the signal to de-convolve the RIR from the primary wave 805 as seen in FIG. 9A. The frequency domain representation of the detected waveform (X) 901 may be de-convolved with the transformed primary waveform (Y) 902 by complex division of the frequency domain representation of the detected waveform with a frequency domain representation of the primary waveform 805. The resulting signal is the transformed room impulse response or room transfer function. This room transfer function may then be transformed back to the time domain using such known techniques as Inverse Discrete Fourier Transform (IDFT), Inverse Discrete Cosine Transform (IDCT) etc., to create the RIR. Note, that for ease of explanation the description of discovery of a room impulse response has been limited to a single detected wave form.

Figure 9B:
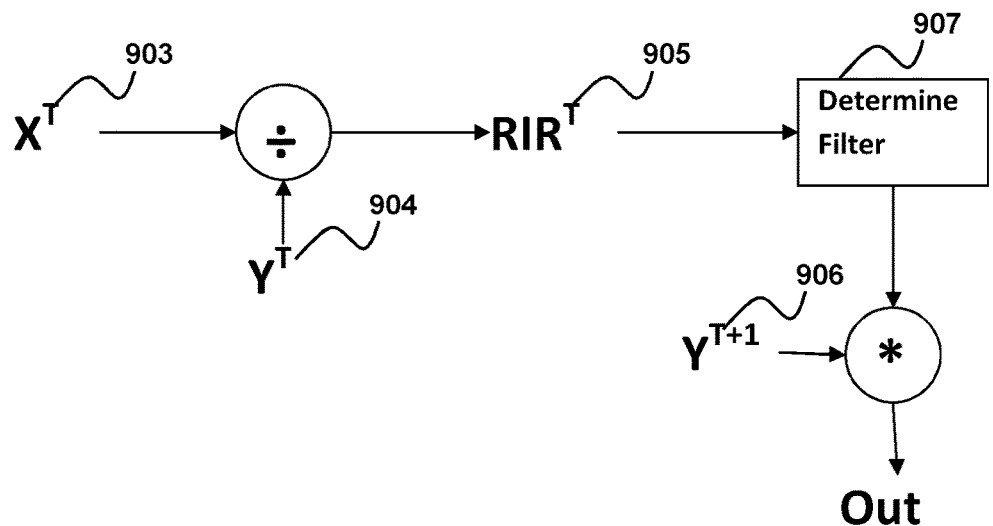
FIG. 9B is a schematic diagram depicting a technique for extracting a room impulse response from a recorded waveform and filtering for unwanted aspects of the room impulse response according to various aspects of the present disclosure.

A key insight of the present disclosure is that RIR is mostly invariant in surround sound systems but may change slightly as the room conditions, layout and occupancy change. Once the impulse response of a room is discovered the primary signal can be filtered selectively to increase or decrease the amplitude of certain portions, e.g., frequency bands, of the speaker driving signal 801 to create a desired effect and the RIR may only need to be updated occasionally. Additionally as seen in FIG. 9B filters may be applied to the RIR and then the resulting filtered RIR may be convolved with the source signal to create the desired sound for the listener. By way of example and not by way of limitation one such filter may simply be an inverse filter which simply inverses the RIR and the inverse RIR is then convolved with the source signal. The detected waveform may be detected from some earlier sample time $(X^T)$ 903 and undergo a de-convolution process as discussed above with the primary waveform from an earlier sample time $(Y^T)$ 904. The resulting waveform (the transformed RIR) 905 may then be used to determine a filter function FF, as indicated at 907 that can be applied to the speaker driving signal 801 to remove or enhance the desired frequencies.

By way of Example and not by way limitation certain frequencies of the filter function FF may be generated from the frequency domain room impulse response RIR as determined above and an ideal frequency domain impulse response $RIR_I$, which may be predetermined, e.g., through experimentation with the sound system under controlled conditions. In some embodiments it may be desirable to remove the RIR entirely in which case the ideal $RIR_I$ is equal to 1 and the Filter Function is simply the inverse RIR as discussed in the example above. Specifically, the time domain filter function FF may be given by Equation 7:

$$FF = \frac{RIR_I}{RIR} \quad \text{(Eq. 7)}$$

It might not be possible to invert the RIR if it contains zeros outside the unit circle, which when inverted would give unstable poles. It is therefore important to ensure that the inversion of RIR yields a stable filter.

By way of example, and not by way of limitation, the filter function FF may be applied to the speaker driving signal 801 through one or more band pass filters and/or band stop filters, which may be implemented in hardware or software. In some implementations, the RIR 905 may be updated at periodic intervals to accommodate for changes in the acoustics of the room, e.g., when windows or doors are opened or closed or when people enter or leave the room. It should be understood that updating the RIR is not limited to the next time in the sample in the series. In some implementations, the RIR 905 may be periodically updated at an arbitrary or user-determined interval. In other implementations the RIR may be determined once and then applied to every subsequent waveform used to drive the speakers.

Sound Optimization in a Multi-speaker System

Figure 10:
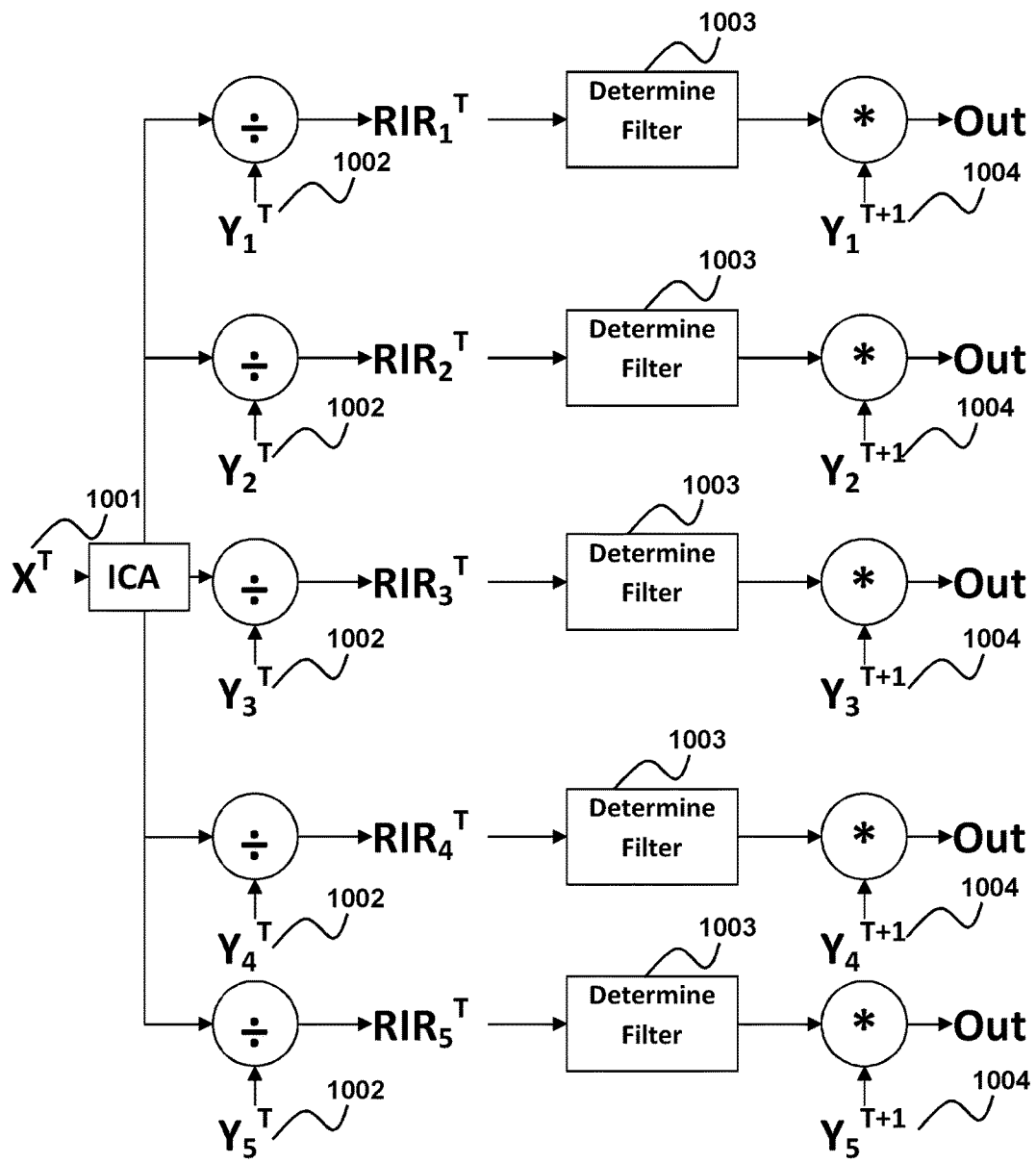
FIG. 10 is a schematic diagram depicting a technique for filtering a room impulse response in a multi-channel sound system according to various aspects of the present disclosure.
Figure 11:
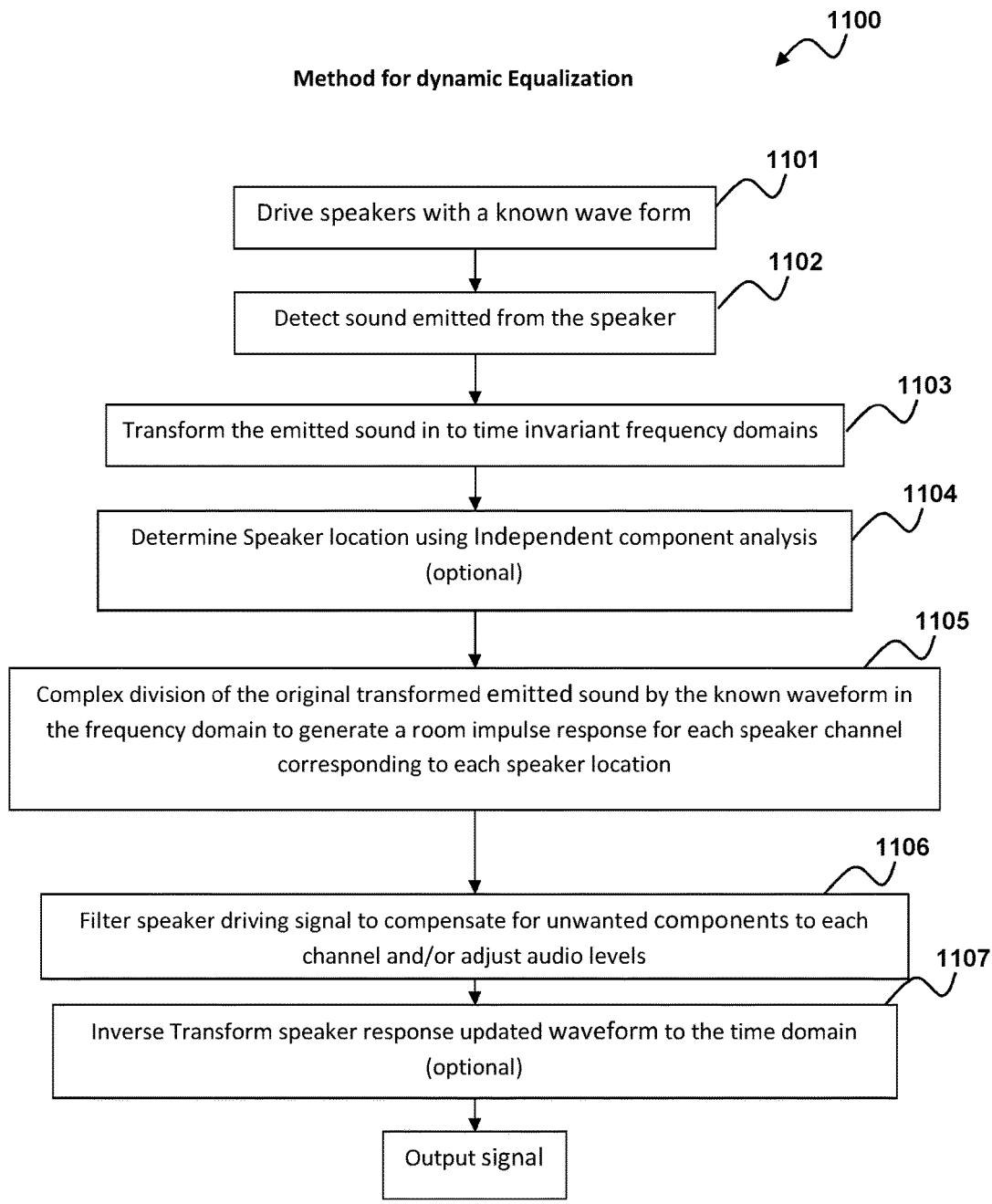
FIG. 11 is a block diagram depicting a method for dynamic equalization of sound in a room according to various aspects of the present disclosure.

The above teachings are not limited to a single speaker or a single primary waveform but may be applied to a multi-channel, multi-speaker sound system as depicted in FIGS. 10 and 11. For ease of explanation the FIG. 10 describes a system with single detected waveform 1001 but the present disclosure should not be considered to be so limited as the described method may be used with any number of detected waveforms which may subsequently be mixed together to provide an optimal representation of the sound in the room. Speakers in the speaker system are initially driven with a known wave form 1101. The sound emitted by the speakers driven by the known waveform is then detected by a the microphone array 1102. The detected waveform then may be transformed from the time domain to time invariant frequency domains 1103 as discussed above. The Transformed detected waveforms may then be separated into individual sources using ICA as described above. Once the individual sources have been determined the signals may be transformed back in to the time domain (if the signals were transformed during the ICA processes) to determine the phase shift between the waveforms, and the angle and distance of each source from the microphone array as described. This information may then be used by the system to match each source signal with its corresponding channel in the multichannel speaker system 1104.

By way of example and not by way of limitation the system may compare a standard speaker layout to the determined source distance, angle and frequency range to determine which source correspond to which standard defined channel. For instance, 5.1 surround sound has 3 forward channels (2 side and 1 center) 2 surround channels and 1 subwoofer channel. By definition the center channel is at the front center of the room therefore the system may define a source found to be more or less equidistant from the microphones in the microphone array to be the center source. Likewise by definition the sound frequencies produced by the subwoofer are lower than the other speakers thus the system will define a lower frequency source to be the subwoofer channel source. The distance information may be used to discover which sources correspond to the left and right channel of the speakers. A third microphone located forward or rear of the at least two microphones in the microphone array may be used to aid in the determination of front and rear surround signals.

In an alternative embodiment determination which of source corresponds to the front or rear surround channels on each side may be performed individually for each channel at the start of the process. A test tone may be played which tests the frequency range characteristics and response of each channel. Once the frequency response of each channel has determined each source may have its frequency response characteristics analyzed after ICA to differentiate it and determine which channel corresponds to which source. Alternatively the speaker manufacturer may have different frequency response characteristics for the front and rear channel speakers that may be used to differentiate the sources during ICA.

After the sources have been matched to their corresponding channels the RIR for each channel may be determined. The ICA process may result in a transformed source signals or the signals may need to be transformed to generate the time invariant frequency domain signals. Once the waveform is transformed each channel may be de-convolved 1105 with complex division of detected channel matched source signal with the primary waveform for each channel $(Y_{1, 2, 3, \ldots n}^T)$ 1002 at each frequency to generate the RIR for each channel $(RIR_{1,2,3 \ldots n}^T)$.

The room impulse response may be used to apply filters to the source signal 1106, 1003. The filters applied to the source signal may be configured to create the desired room impulse response for each speaker, e.g., as described above with respect to FIG. 9A and FIG. 9B. According to aspects of the present disclosure the RIR may be determined at— pre-defined intervals for each speaker, by way of example and not by way of limitation the RIR may be generated at each sample and used to filter the next sample, alternatively the RIR may be determined once and used filter each subsequent primary waveform of each channel.

In some implementations the filtering of the speaker driving signals may take place digitally in the frequency domain. In such implementations, once the speaker-driving waveforms have been filtered, the signal may be transformed back to a time domain signal 1107. In other implementations the filtering may be applied directly to the time domain speaker driving signal, e.g., when analog filters are applied to analog speaker driving signals. Transformation from time invariant frequency domains to the time domain may be carried out using known transformation techniques such as IDFT, IDCT and the like.

After transformation the generated time domains signals may be used to drive the speaker in their corresponding channel.

According to additional aspects of the present disclosure the detected source signals may be used to optimize the sound experience for the user. By way of example and not by way of limitation the sound experience may be optimized by decreasing the audio level of an audio source that is determined to be closer to the microphone array than the other audio sources. The sound experience may be further optimized by automatically rearranging distribution of speaker driving signals among speakers that are incorrectly arranged. The system may initially test each individual channel and detect the location of each sound source connected to the channel as described above. From this information the system can determine whether each channel is in a standard location or out of place. If an out of place signal is detected the system may switch the signal driving an out of place speaker to the correct channel without user input. Similarly based on the initial test of the speakers the system may apply additional filters to the waveform for the channel. By way of example and not by way of limitation turning again to FIG. 3A the system may apply a delay filter and/or additional frequency filters to the waveform of the back right surround speaker to simulate that the speaker is located in the back right corner of the room instead of middle right side. Similarly a delay filter may be applied to back left surround speaker and additionally the volume of the back left speaker may be decreased to better simulate the correct distance and location of the speaker from the user.

The presently described system also allows additional real-time monitoring and adjustment of speaker output. By way of example and not by way of limitation the system may detect when a source is obstructed or otherwise occluded. Using ICA as described above the system may be able to differentiate between the sounds sources received based on the surround sound system audio channels. Furthermore the system may detect that the audio level of a source corresponding to an audio channel is lower than the other sources and in response the system may increase the volume of that channel. Conversely the system may detect that the volume of a particular source corresponding to an audio channel is higher than the other channels and in response lower the volume of that particular channel corresponding to the particular audio source. In this way the system may dynamically adjust the sound level in a room and account for an occluded or otherwise obstructed speaker by increasing the audio volume of the channel of the speaker and when the person or obstruction moves away from the speaker the system may reduce the volume of the channel.

In some embodiments an audio threshold may be used to set the perceived audio volume of the room. The system may be configured to detect each sound source and determine the channel corresponding to the sound source as described above. With this information the system may tune the overall audio volume of each channel to match an audio threshold for the room. The audio threshold may be an average volume for the room or may be defined on a frequency basis. If the threshold is defined on the basis of frequency each channel may be adjusted for a desired frequency volume level to match the threshold. A further benefit of the above described system is that it allows for the tuning of the actual perceived volume and frequency response of the room instead of an idealized version of the audio devoid of the room response and other components. This enhanced information allows for better audio equalization and easier tuning of sound as discrepancies in speakers can be compensated on a per channel basis.

System

Figure 12:
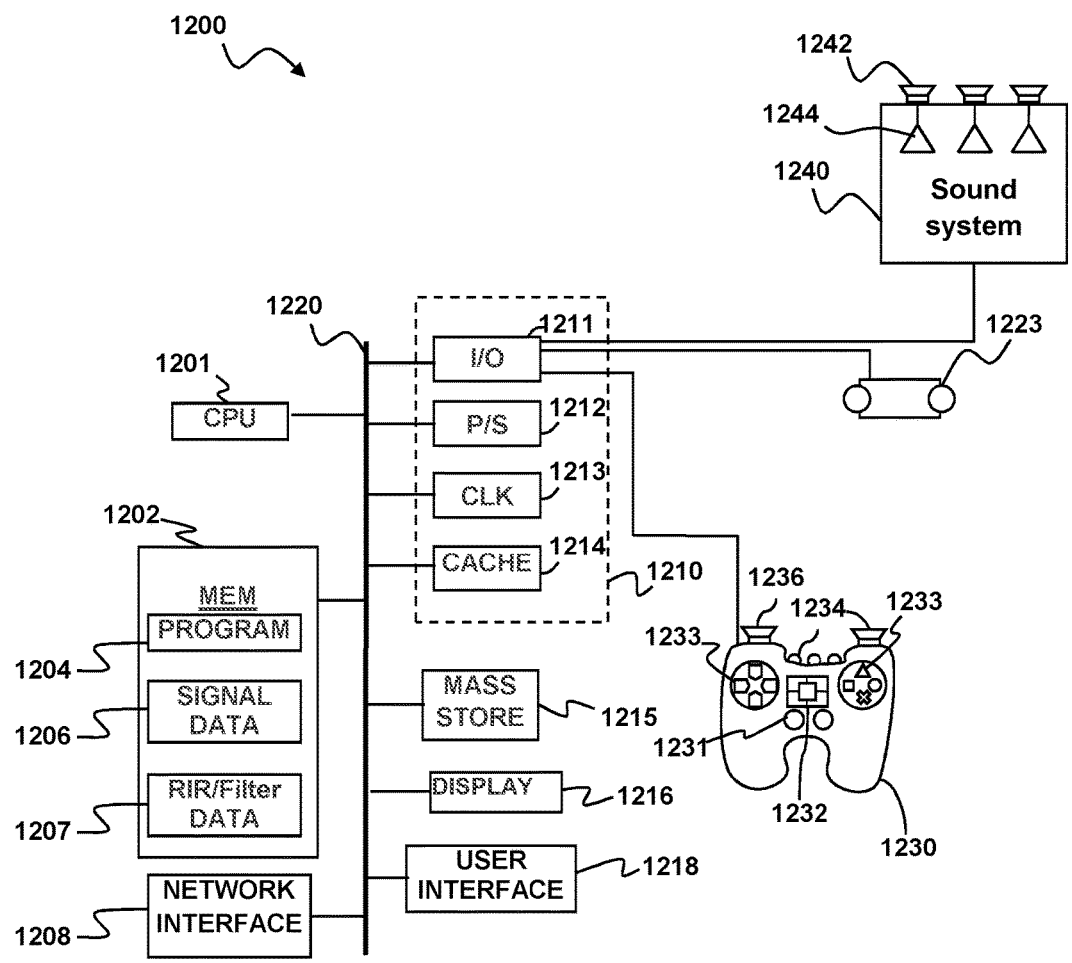
FIG. 12 is a block diagram depicting a system for dynamic equalization of sound in a room according to various aspects of the present disclosure.

Turning to FIG. 12, a block diagram of an example system 1200 configured to localize sounds in accordance with aspects of the present disclosure.

The example system 1200 may include computing components which are coupled to a sound system 1240 in order to process and/or output audio signals in accordance with aspects of the present disclosure. By way of example, and not by way of limitation, in some implementations the sound system 1240 may be a set of stereo speakers or surround speakers, some or all of the computing components may be part of a standardized surround sound system 1240 the microphone array may be coupled to a controller 1230 or may be comprised of several controllers 1230 each coupled to one or more microphones 1236, 1234 or it may be a stand-alone array of several microphones 1223 in order to process received audio signals to determine sound locations and correlate those sound locations with channels in accordance with aspects of the present disclosure. By way of example, the sound system 1240 may be configured in any known configuration, such as stereo speakers, 5.1 surround sound, 7.1 surround sound, 10.2 surround sound, and the like. Furthermore, in some implementations, the system 1200 may be part of an embedded system, mobile phone, personal computer, tablet computer, portable game device, workstation, game console, set-top box, stand-alone amplifier unit and the like.

The example system may additionally be coupled to a game controller 1230. The game controller may have numerous features which aid in tracking its location and which may be used to assist in the optimization of sound. As discussed a first microphone 1236 may be coupled to the controller, a second microphone 1234 may also be coupled to the controller to form a microphone array. A third microphone out of line with the first and second microphones may also be coupled to the game controller for enhanced location detection. The game controller may also have numerous light sources that may be detected by an image capture unit and the location of the controller within the room may be detected from the location of the light sources. Other location detection systems may be coupled to the game controller 1230, including accelerometers and/or gyroscopic displacement sensors to detect movement of the controller within the room. According to aspects of the present disclosure the game controller 1230 may also have user input controls such as a direction pad and buttons 1233, joysticks 1231, and/or Touchpads 1232. The game controller may also be mountable to the user's body.

The system 1200 may be configured to process audio signals to de-convolve and convolve impulse responses in accordance with aspects of the present disclosure. The system 1200 may include one or more processor units 1201, which may be configured according to well-known architectures, such as, e.g., single-core, dual-core, quad-core, multi-core, processor-coprocessor, accelerated processing unit and the like. The system 1200 may also include one or more memory units 1202 (e.g., RAM, DRAM, ROM, and the like).

The processor unit 1201 may execute one or more programs 1204, portions of which may be stored in the memory 1202, and the processor 1201 may be operatively coupled to the memory 1202, e.g., by accessing the memory via a data bus 1220. The programs may be configured to process source audio signals 1206, e.g. for converting the signals to surround sound channel signals for later user, or output to the speakers 1240. By way of example, and not by way of limitation, the memory 1202 may include programs 1204, execution of which may cause the system 1200 to perform a method having one or more features in common with the example methods above, such as method 600 of FIG. 6, 700 of FIG. 7, 800 of FIG. 8 and/or method 1100 of FIG. 11. By way of example, and not by way of limitation, the programs 1204 may include processor executable instructions which cause the system 1200 to determine speaker locations and filter one or more channels of a source signal with one or more filters representing a desirable change to the room impulse responses and or audio levels to optimize the perceived quality of the sources of sounds in a room.

The system 1200 may also include well-known support circuits 1210, such as input/output (I/O) circuits 1211, power supplies (P/S) 1212, a clock (CLK) 1213, and cache 1214, which may communicate with other components of the system, e.g., via the bus 1220. The system 1200 may also include a mass storage device 1215 such as a disk drive, CD-ROM drive, tape drive, flash memory, or the like, and the mass storage device 1215 may store programs and/or data. The system 1200 may also include a user interface 1218 and a display 1216 to facilitate interaction between the system 1200 and a user. The user interface 1218 may include a keyboard, mouse, light pen, touch interface, or other device. The system 1200 may also execute one or more general computer applications (not pictured), such as a video game, which may incorporate aspects of surround sound as computed by the convolution programs 1204.

The system 1200 may include a network interface 1208, configured to enable the use of Wi-Fi, an Ethernet port, or other communication methods. The network interface 1208 may incorporate suitable hardware, software, firmware or some combination thereof to facilitate communication via a telecommunications network. The network interface 1208 may be configured to implement wired or wireless communication over local area networks and wide area networks such as the Internet. The system 1200 may send and receive data and/or requests for files via one or more data packets over a network.

It will readily be appreciated that many variations on the components depicted in FIG. 12 are possible, and that various ones of these components may be implemented in hardware, software, firmware, or some combination thereof. For example, some features or all features of the convolution programs contained in the memory 1202 and executed by the processor 1201 may be implemented via suitably configured hardware, such as one or more application specific integrated circuits (ASIC) or a field programmable gate array (FPGA) configured to perform some or all aspects of example processing techniques described herein.

CONCLUSION

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "a", or "an" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for adjustment of room sound levels, the method comprising;
   a) driving a speaker with a known waveform;
   b) detecting a sound wave from the speaker with at least two microphones wherein the at least two microphones are configured in a known orientation, wherein the at least two microphones are separate and attached to separate game controllers;
   c) utilizing the known waveform and the sound wave detected by the at least two microphones and the known orientation of the at least two microphones to generate a room sound dynamic; and
   d) filtering a signal used to drive the speaker to adjust a sound level of the speaker to account for the room sound dynamic.

2. The method of claim 1 wherein the at least two microphones are coupled to a game controller.

3. The method of claim 1 wherein the room sound dynamic comprises a room impulse response.

4. The method of claim 3 wherein d) applying a filter comprises applying a filter to compensate for unwanted sound frequencies in the room impulse response.

5. The method of claim 1 wherein the room sound dynamic comprises a speaker layout of the room.

6. The method of claim 5 wherein the room sound dynamic further comprises a distance and/or angle of the speakers with respect to the microphone.

7. The method of claim 5 wherein c) includes determining a speaker layout of two or more speakers in a room by performing Independent component analysis on signals from the two or more microphones to isolate sounds from the two or more speakers and analyzing isolated sounds from each of the two or more speakers to determine speaker locations.

8. The method of claim 1 wherein the method further comprises performing steps a) through b) for each speaker channel in a sound system and performing step c) through d) after all of the channels have been detected.

9. The method of claim 1 wherein adjusting the sound level in d) compensates for movement of a person in front the speaker.

10. The method of claim 1 wherein adjusting the sound level in d) compensates for a furniture layout in the room or the locations of speakers in the room.

11. A non-transitory computer readable medium with executable instructions embodied therein wherein execution of the instructions cause a processor to carry out a method comprising;
a) driving a speaker with a known waveform;
b) detecting a sound wave from the speaker with at least two microphones wherein the at least two microphones are configured in a known orientation, wherein the at least two microphones are separate and attached to separate game controllers;
c) utilizing the known waveform and the sound wave detected by the at least two microphones and the known orientation of the at least two microphones to generate a room sound dynamic;
d) filtering a signal used to drive the speaker to adjust a sound level of the speaker to account for the room sound dynamic.

12. The non-transitory computer readable medium of claim 11 wherein the at least two microphones are coupled to a game controller.

13. The non-transitory computer readable medium of claim 11 wherein the room sound dynamic comprises a speaker layout of the room.

14. The non-transitory computer readable medium of claim 11 wherein the room sound dynamic comprises the room impulse response.

15. The non-transitory computer readable medium of claim 14 wherein d) applying a filter comprises applying a filter to compensate for unwanted sound frequencies in the room impulse response.

16. The non-transitory computer readable medium of claim 11 wherein the room sound dynamic further comprises a size of a room and/or a distance between speakers relative to the microphone.

17. The method of claim 11 wherein c) includes determining a speaker layout of two or more speakers in a room by performing Independent component analysis on signals from the two or more microphones to isolate sounds from the two or more speakers and analyzing isolated sounds from each of the two or more speakers to determine speaker locations.

18. A system, comprising:
a processor;
a memory coupled to the processor, the memory having executable instructions embodied therein, the instructions being configured to cause the processor to carry out a method when executed, the method comprising;
a) driving a speaker with a known waveform;
b) detecting a sound wave from the speaker with at least two microphones wherein the at least two microphones are configured in a known orientation, wherein the at least two microphones are separate and attached to separate game controllers;
c) utilizing the known waveform and the sound wave detected by the at least two microphones and the known orientation of the at least two microphones to generate a room sound dynamic;
d) filtering a signal used to drive the speaker to adjust a sound level of the speaker to account for the room sound dynamic.

19. The system of claim 18, further comprising one or more speakers operably coupled to the processor.

20. The system of claim 19, wherein the one or more speakers include a plurality of speakers.

21. The system of claim 19, wherein the one or more speakers include a plurality of speakers of a surround sound system.

22. The system of claim 19, wherein the one or more speakers include a plurality of speakers of a 5.1 surround sound system.

23. The system of claim 19, wherein the one or more speakers include a plurality of speakers of a 7.1 surround sound system.

24. The method of claim 1 wherein the room sound dynamic is updated at periodic intervals to accommodate changes in an acoustic of the room.

25. The non-transitory computer readable medium of claim 11, wherein the room sound dynamic is updated at periodic intervals to accommodate changes in an acoustic of the room.

26. The system of claim 18, wherein the room sound dynamic is updated at periodic intervals to accommodate changes in an acoustic of the room.

* * * * *